United States Patent
Iwashita et al.

(10) Patent No.: US 9,829,791 B2
(45) Date of Patent: Nov. 28, 2017

(54) PHOTOSENSITIVE RESIN COMPOSITION, PHOTOSENSITIVE ELEMENT, SEMICONDUCTOR DEVICE AND METHOD FOR FORMING RESIST PATTERN

(71) Applicant: HITACHI CHEMICAL COMPANY, LTD., Tokyo (JP)

(72) Inventors: Kenichi Iwashita, Tokyo (JP); Tetsuya Kato, Tokyo (JP); Masahiko Ebihara, Tokyo (JP); Yasuharu Murakami, Tokyo (JP)

(73) Assignee: HITACHI CHEMICAL COMPANY, LTD., Tokyo (JP)

(*) Notice: Subject to any disclaimer, the term of this patent is extended or adjusted under 35 U.S.C. 154(b) by 0 days.

(21) Appl. No.: 15/025,655

(22) PCT Filed: Sep. 29, 2014

(86) PCT No.: PCT/JP2014/075923
§ 371 (c)(1),
(2) Date: Mar. 29, 2016

(87) PCT Pub. No.: WO2015/046521
PCT Pub. Date: Apr. 2, 2015

(65) Prior Publication Data
US 2016/0216608 A1 Jul. 28, 2016

(30) Foreign Application Priority Data

Sep. 30, 2013 (JP) .................................. 2013-203673
Dec. 4, 2013 (JP) .................................. 2013-251324

(51) Int. Cl.
*G03F 7/038* (2006.01)
*G03F 7/38* (2006.01)
*G03F 7/40* (2006.01)
*H05K 3/28* (2006.01)
*G03F 7/004* (2006.01)
*H05K 3/06* (2006.01)
*H05K 3/12* (2006.01)

(52) U.S. Cl.
CPC ............ *G03F 7/038* (2013.01); *G03F 7/0047* (2013.01); *G03F 7/0382* (2013.01); *G03F 7/38* (2013.01); *G03F 7/40* (2013.01); *H05K 3/287* (2013.01); *H05K 3/064* (2013.01); *H05K 3/1258* (2013.01); *H05K 2201/0209* (2013.01)

(58) Field of Classification Search
CPC ...... H05K 3/287; H05K 3/064; H05K 3/1258; H05K 2201/0209
See application file for complete search history.

(56) References Cited

U.S. PATENT DOCUMENTS

| | | | |
|---|---|---|---|
| 2006/0228562 A1* | 10/2006 | Ukawa | C08G 59/027 428/413 |
| 2009/0239080 A1* | 9/2009 | Ito | C08F 212/14 428/411.1 |
| 2010/0196822 A1 | 8/2010 | Sasaki et al. | |
| 2016/0216608 A1 | 7/2016 | Iwashita | |

FOREIGN PATENT DOCUMENTS

| | | |
|---|---|---|
| JP | H6-059444 A | 3/1994 |
| JP | H9-087366 A | 3/1997 |
| JP | 2003-215802 A | 7/2003 |
| JP | 2008-241741 A | 10/2008 |
| JP | 2008-241741 A1 * | 10/2008 |
| JP | 2009-042422 A | 2/2009 |
| JP | 2010-197996 A | 9/2010 |
| JP | 2010-224533 A | 10/2010 |
| JP | 2011-013622 A | 1/2011 |
| JP | 2011-186019 A | 9/2011 |
| JP | 2012-116975 A | 6/2012 |
| WO | 2008/010521 A1 | 1/2008 |
| WO | 2008/075495 A1 | 6/2008 |
| WO | 2009/150918 A1 | 12/2009 |
| WO | WO 2009/150918 A1 * | 12/2009 |
| WO | 2012/086610 A1 | 6/2012 |

OTHER PUBLICATIONS

English translation of WO 2009150918 a1 obtained from WIP Patent scope website with Google translate , Jun. 23, 2016, 16 pages.*
English translation of JP, 2008-241741 a1, A (2008) from machine translation from AIPN Japan Patent Office National Center for Industrial Property Information and Training, generated Jun. 22, 2016, 17 pages.*
International Search Report for PCT/JP2014/075923 dated Dec. 22, 2014; English translation submitted herewith (5 Pages).
International Search Report for PCT/JP2014/075925 dated Dec. 22, 2014; English translation submitted herewith (5 Pages).
Office Action of U.S. Appl. No. 15/025,796 dated Mar. 14, 2017 in English.

* cited by examiner

*Primary Examiner* — Cynthia Hamilton
(74) *Attorney, Agent, or Firm* — Fitch, Even, Tabin & Flannery, LLP

(57) ABSTRACT

A photosensitive resin composition comprises a component (A): a resin having a phenolic hydroxyl group; a component (B): an aliphatic compound having two or more functional groups, the functional groups being one or more group selected from an acryloyloxy group, a methacryloyloxy group, a glycidyloxy group and a hydroxyl group; a component (C): a photosensitive acid generator; and a component (D): an inorganic filler having an average particle diameter of 100 nm or less.

20 Claims, 1 Drawing Sheet

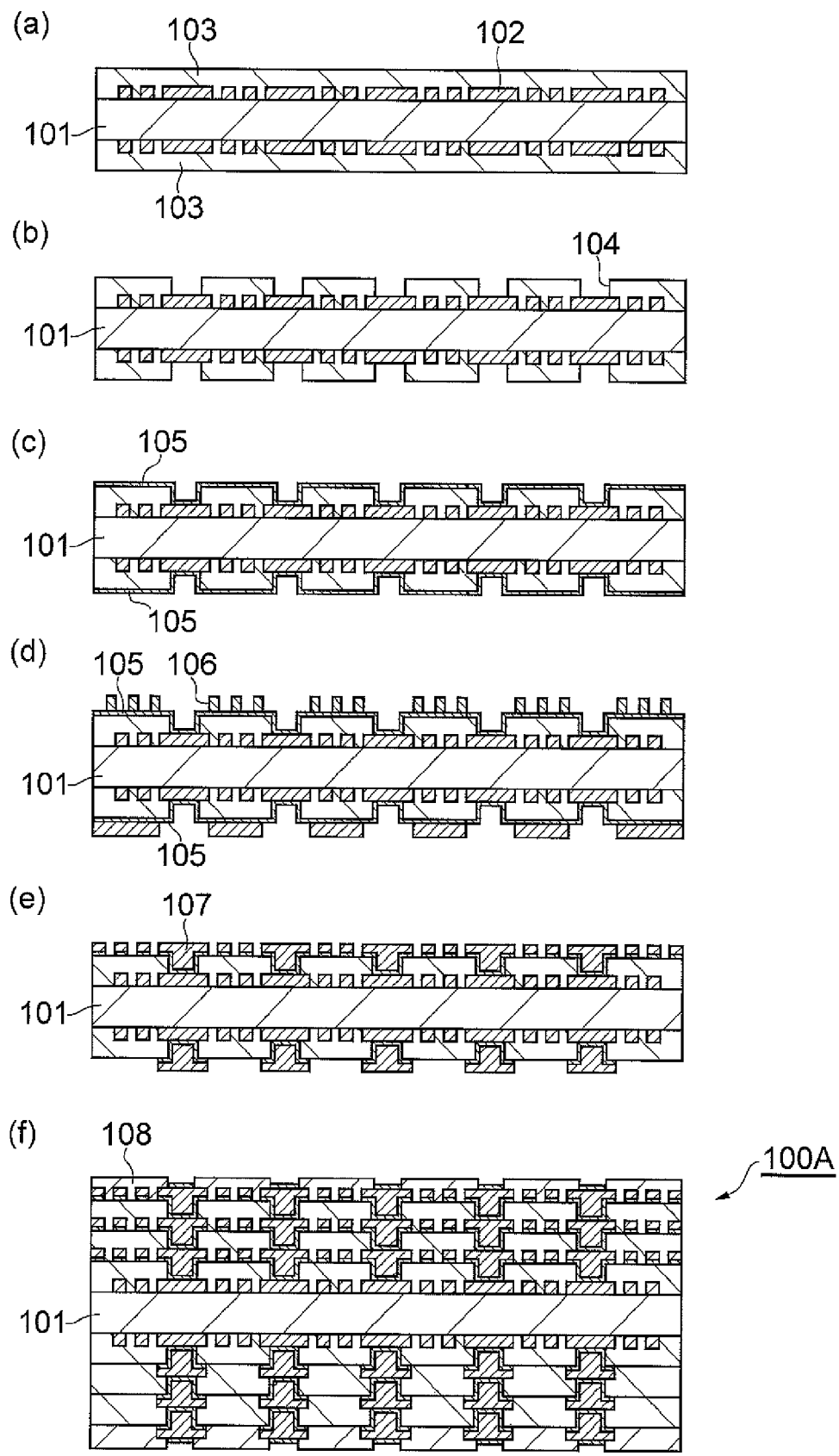

PHOTOSENSITIVE RESIN COMPOSITION, PHOTOSENSITIVE ELEMENT, SEMICONDUCTOR DEVICE AND METHOD FOR FORMING RESIST PATTERN

TECHNICAL FIELD

The present invention relates to a photosensitive resin composition, a photosensitive element, a semiconductor device, and a method for forming a resist pattern.

BACKGROUND ART

In order to form fine patterns in manufacturing semiconductor devices or printed wiring boards, for example, a negative type photosensitive resin composition has been used. In the method, a photosensitive layer formed on a base material (a chip for semiconductor device, and a substrate for printed wiring board) by application of a photosensitive resin composition or the like is irradiated with active rays through a specified pattern so as to cure the exposed portion. Further, the unexposed portion is selectively removed by a developer so as to form a resist pattern as cured film of the photosensitive resin composition on the base material. The photosensitive resin composition is therefore required to have high sensitivity to active rays and to be excellent in formability of fine patterns (resolution) and the like. Accordingly, a photosensitive resin composition containing a novolac resin soluble in alkaline aqueous solution, an epoxy resin and a photo-acid generator, a photosensitive resin composition containing an alkali-soluble epoxy compound having a carboxyl group and a photo-cationic polymerization initiator, and the like have been proposed (for example, refer to Patent Literatures 1 and 2).

Further, a surface protective film and an interlayer insulating film for use in a semiconductor device are required to have insulation reliability such as heat resistance, electrical properties, mechanical properties and the like. Accordingly, a photosensitive resin composition which further contains a cross-linkable monomer has been proposed (for example, refer to Patent Literature 3).

Meanwhile, along with improvement in performance of electronic equipment in recent years, higher integration and higher reliability of semiconductor devices have been achieved year by year. Along with high integration of semiconductor devices, the formation of further finer patterns and entirely thin-filmed semiconductor devices are required. In thinning of the entire semiconductor device, however, a warp caused by the difference in thermal expansion coefficient between a chip and a surface protective film or an interlayer insulating film becomes a serious problem. Consequently a photosensitive resin composition is required to have a thermal expansion coefficient close to the thermal expansion coefficient of the chip ($3 \times 10^{-6}$/° C.). In other words, reduction in the thermal expansion coefficient is strongly required. Accordingly, in order to achieve the reduction in the thermal expansion of a photosensitive resin composition, for example, a photosensitive resin composition containing an inorganic filler has been proposed (for example, refer to Patent Literature 4).

Further, when the interlayer insulating film having an increased thickness is formed, the insulation between wirings in the thickness direction of the layer can be enhanced to prevent short circuiting of wiring, and therefore the reliability of the insulation between wirings is improved. Further, in a case of mounting a chip, when a semiconductor device has a thick interlayer insulating film, the stress applied to the pad from a solder bump can be relaxed, so that connection failures hardly occur in mounting. Accordingly, in terms of the insulation reliability and the productivity in mounting a chip, a thick film of photosensitive resin composition with a thickness more than 20 μm is also required to be formed.

CITATION LIST

Patent Literature

Patent Literature 1: JP H9-087366 A
Patent Literature 2: WO 2008/010521
Patent Literature 3: JP 2003-215802 A
Patent Literature 4: JP 2011-13622 A

SUMMARY OF INVENTION

Technical Problem

However, for example, the photosensitive resin composition described in Patent Literature 1 has a resolution with a space width of about 40 μm when a coating film has a thickness of 50 μm, which is insufficient for a highly integrated semiconductor device. The photosensitive resin composition described in Patent Literature 2 cannot exhibit sufficient heat resistance in some cases. Further, the photosensitive resin composition described in Patent Literature 3 provides excellent resolution with a space width of about 5 μm when a coating film has a thickness of 10 μm, but excellent resolution cannot be obtained when a thick film is made therefrom. Further, the case of being highly filled with an inorganic filler using the photosensitive resin composition described in Patent Literature 4 to lower the thermal expansion coefficient tends to result in degradation in resolution due to increased light scattering or light absorption.

An object of the present invention is to solve the problems associated with the conventional arts as described above and to provide a photosensitive resin composition from which a resist pattern having excellent resolution and heat resistance with a low heat expansion coefficient can be formed even when a coating film having a thickness of more than 20 μm is formed.

Solution to Problem

As a result of extensive studies to solve the above problems, the present inventors have found a photosensitive resin composition having excellent properties. Namely, the photosensitive resin composition of the present invention comprises a component (A): a resin having a phenolic hydroxyl group; a component (B): an aliphatic compound having two or more functional groups, the functional groups being one or more groups selected from an acryloyloxy group, a methacryloyloxy group, a glycidyloxy group and a hydroxyl group; a component (C): a photosensitive acid generator; and a component (D): an inorganic filler having an average particle diameter of 100 nm or less.

Preferably the component (B) is an aliphatic compound having three or more functional groups, the functional groups being one or more groups selected from an acryloyloxy group, a methacryloyloxy group, a glycidyloxy group and a hydroxyl group.

The photosensitive resin composition of the present invention preferably further comprises a component (E): a compound having at least one selected from the group consisting of an aromatic ring, a heterocycle and an alicycle, and a methylol group or an alkoxyalkyl group.

The photosensitive resin composition of the present invention preferably contains 20 to 70 parts by mass of the component (B) relative to 100 parts by mass of the component (A).

The component (D) is preferably silica.

The present invention also provides a photosensitive element comprising a supporting material and a photosensitive layer formed on the supporting material, the photosensitive layer being formed of the photosensitive resin composition.

The present invention also provides a semiconductor device comprising a cured product of the photosensitive resin composition as a surface protective film or an interlayer insulating film.

The present invention provides a method for forming a resist pattern comprising: a step of applying the photosensitive resin composition onto a substrate and drying the applied photosensitive resin composition so as to form a photosensitive layer, a step of exposing the photosensitive layer to an active ray in order to form a predetermined pattern and performing a heat-treatment after exposure (hereinafter, this heat-treatment is also referred to as "post-exposure baking"), and a step of developing the photosensitive layer after heat-treatment and heat-treating the obtained resin pattern.

The present invention further provides a method for forming a resist pattern comprising: a step of forming the photosensitive layer of the photosensitive element on a substrate, a step of exposing the photosensitive layer to an active ray in order to form a predetermined pattern and performing a post-exposure heat-treatment, and a step of developing the photosensitive layer after heat-treatment and heat-treating the obtained resin pattern.

Advantageous Effects of Invention

The photosensitive resin composition of the present invention allows a resist pattern having excellent resolution, heat resistance and further lower thermal expansion coefficient to be formed, even when a coating film having a thickness more than 20 µm is formed.

BRIEF DESCRIPTION OF DRAWINGS

FIG. 1 is a schematic view illustrating the manufacturing method of a multi-layered printed wiring board in the embodiment.

DESCRIPTION OF EMBODIMENTS

An embodiment of the present invention will be more specifically described in the following, though the present invention is not limited thereto.

[Photosensitive Resin Composition]

The photosensitive resin composition of the present embodiment contains: a component (A) a resin having a phenolic hydroxyl group; a component (B): an aliphatic compound having two or more functional groups, the functional groups being one or more groups selected from an acryloyloxy group, a methacryloyloxy group, a glycidyloxy group and a hydroxyl group; a component (C): a photosensitive acid generator; and a component (D): an inorganic filler having an average particle diameter of 100 nm or less.

The present inventors presume that the reasons why a resist pattern having high resolution and heat resistance can be formed from the photosensitive resin composition of the present embodiment are as follows. First, the solubility of the resin having a phenolic hydroxyl group (A) in a developer is drastically improved with addition of the component (B) in an unexposed portion. Second, in an exposed portion, due to the acid generated from the photosensitive acid generator (C), two or more oxirane rings of the component (B) not only react with each other to be cross-linked but also react with the phenolic hydroxyl group of the component (A), so that the solubility of the composition in the developer is drastically reduced. The present inventors presume that due to the resulting remarkable difference in solubility in a developer between the unexposed portion and an exposed portion when developing, sufficient resolution can be obtained, and due to heat treatment of the pattern after development, the cross-linking of the component (B) and the reaction with the component (A) further proceed to achieve the sufficient heat resistance.

The photosensitive resin composition of the present embodiment may comprise a component (E): a compound having at least one selected from the group consisting of an aromatic ring, a heterocycle and an alicycle, and a methylol group or an alkoxyalkyl group; a component (F): a sensitizer; a component (G): a solvent; a component (H): a silane coupling agent, a component (I): amine; a component (J): an organic peroxide; a component (K): a leveling agent; and the like on an as needed basis.

<Component (A)>

Examples of the resin having a phenolic hydroxyl group as component (A) preferably include a resin soluble in an alkali aqueous solution, particularly preferably a novolac resin, though not specifically limited. The novolac resin, for example, can be obtained from condensation of phenols and aldehydes under presence of a catalyst.

Examples of the phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, catechol, resorcinol, pyrogallol, α-naphthol, β-naphthol, etc.

Further, the aldehydes include, for example, formaldehyde, paraformaldehyde, acetaldehyde, benzaldehyde, etc.

Specific examples of the novolac resin include a phenol/formaldehyde condensation novolac resin, a cresol/formaldehyde condensation novolac resin, a phenol-naphthol/formaldehyde condensation novolac resin, etc.

Further, examples of the component (A) other than novolac resins include polyhydroxystyrene and a copolymer thereof, a phenol-xylylene glycol condensation resin, a cresol-xylylene glycol condensation resin, a phenol-dicyclopentadiene condensate resin, etc. A single kind of component (A) or a mixture of two or more kinds of the components (A) may be used.

From the viewpoints of the further excellent resolution, developability, thermal shock, heat resistance, etc., of a cured film to be obtained, the component (A) has a weight average molecular weight of preferably 100000 or less, more preferably 1000 to 80000, furthermore preferably 2000 to 50000, particularly preferably 2000 to 20000, extremely preferably 5000 to 15000.

The content of the component (A) is preferably 10 to 80 mass %, more preferably 15 to 60 mass %, furthermore preferably 20 to 40 mass %, relative to the total of the photosensitive resin composition (excluding the component (G) when used). With a content of the component (A) in this range, the film formed from the photosensitive resin composition to be obtained tends to have further excellent developability in an alkali aqueous solution.

<Component (B)>

Component (B): An aliphatic compound having two or more functional groups, the functional groups being one or more groups selected from an acryloyloxy group, a methacryloyloxy group, a glycidyloxy group and a hydroxyl group preferably has three or more of the above-described functional groups. The upper limit of the number of the functional groups is, for example, 12, though not particularly limited. Specific examples of the component (B) include the compounds represented by the formulas (7) to (10). The "aliphatic compound" means a compound having an aliphatic skeleton as main skeleton and including no aromatic ring and no heterocycle.

[Chemical Formula 1]

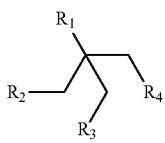

(7)

[Chemical Formula 2]

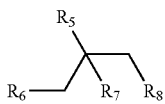

(8)

[Chemical Formula 3]

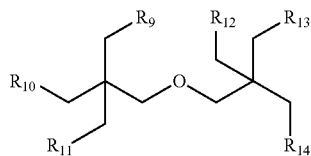

(9)

[Chemical Formula 4]

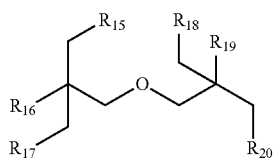

(10)

[Chemical Formula 5]

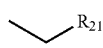

(11)

[Chemical Formula 6]

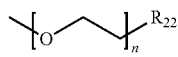

(12)

[Chemical Formula 7]

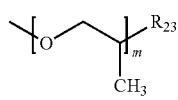

(13)

[In the formulas (7) to (10), $R_1$, $R_5$, $R_{16}$ and $R_{19}$ each represent a hydrogen atom, a methyl group, an ethyl group, a hydroxyl group or a group represented by the formula (11); $R_{21}$ represents a hydroxyl group, a glycidyloxy group, an acryloyloxy group or a methacryloyloxy group; $R_2$, $R_3$, $R_4$, $R_6$, $R_7$, $R_8$, $R_9$, $R_{10}$, $R_{11}$, $R_{12}$, $R_{13}$, $R_{14}$, $R_{15}$, $R_{17}$, $R_{18}$ and $R_{20}$ each represent a hydroxyl group, a glycidyloxy group, an acryloyloxy group, a methacryloyloxy group, a group represented by the formula (12), or a group represented by the formula (13); $R_{22}$ and $R_{23}$ each represent a hydroxyl group, a glycidyloxy group, an acryloyloxy group or a methacryloyloxy group; and n and m each are an integer of 1 to 10.]

Examples of the compound having a glycidyloxy group include ethylene glycol diglycidyl ether, diethylene glycol diglycidyl ether, propylene glycol diglycidyl ether, tripropylene glycol diglycidyl ether, neopentyl glycol diglycidyl ether, 1,6-hexanediol diglycidyl ether, glycerol diglycidyl ether, pentaerythritol tetraglycidyl ether, trimethylolethane triglycidyl ether, trimethylolpropane triglycidyl ether, glycerol propoxylate triglycidyl ether, 1,4-cyclohexanedimethanol diglycidyl ether, and diglycidyl 1,2-cyclohexane-dicarboxylate, etc.

Among the compounds having a glycidyloxy group, trimethylolethane triglycidyl ether or trimethylolpropane triglycidyl ether is preferred from the viewpoints of the excellent sensitivity and resolution.

Examples of the compound having a glycidyloxy group include EPOLIGHT 40E, EPOLIGHT 100E, EPOLIGHT 70P, EPOLIGHT 200P, EPOLIGHT 1500NP, EPOLIGHT 1600, EPOLIGHT 80MF, and EPOLIGHT 100MF (all the above are made by Kyoeisha Chemical Co., Ltd., trade names), an alkyl-type epoxy resin ZX-1542 (made by Nippon Steel and Sumikin Chemical Co., Ltd., trade name), DENACOL EX-212L, DENACOL EX-214L, DENACOL EX-216L, DENACOL EX-321L, and DENACOL EX-850L (all the above made by Nagase ChemteX Corporation, trade names). One of the compounds having a glycidyloxy group may be used singly, or a mixture of two or more may be used.

Examples of the compound having an acryloyloxy group include EO-modified dipentaerythritol hexaacrylate, PO-modified dipentaerythritol hexaacrylate, dipentaerythritol hexaacrylate, EO-modified ditrimethylolpropane tetraacrylate, PO-modified ditrimethylolpropane tetraacrylate, ditrimethylolpropane tetraacrylate, EO-modified pentaerythritol tetraacrylate, PO-modified pentaerythritol tetraacrylate, pentaerythritol tetraacrylate, EO-modified pentaerythritol triacrylate, PO-modified pentaerythritol triacrylate, pentaerythritol triacrylate, EO-modified trimethylolpropane acrylate, PO-modified trimethylolpropane acrylate, trimethylolpropane acrylate, EO-modified glycerol triacrylate, PO-modified glycerol triacrylate, and glycerol triacrylate. One of these compounds having an acryloyloxy group may be used singly, or a mixture of two or more thereof may be used. EO represents an ethyleneoxy group, and PO represents a propyleneoxy group.

Examples of the compound having a methacryloyloxy group include EO-modified dipentaerythritol hexamethacrylate, PO-modified dipentaerythritol hexamethacrylate, dipentaerythritol hexamethacrylate, EO-modified ditrimethylolpropane tetramethacrylate, PO-modified ditrimethylolpropane tetramethacrylate, ditrimethylolpropane tetramethacrylate, EO-modified pentaerythritol tetramethacrylate, PO-modified pentaerythritol tetramethacrylate, pentaerythritol tetramethacrylate, EO-modified pentaerythritol trimethacrylate, PO-modified pentaerythritol trimethacrylate, pentaerythritol trimethacrylate, EO-modified trimethylolpropane methacrylate, PO-modified trimethylolpropane methacrylate, trimethylolpropane methacrylate, EO-modified glycerol trimethacrylate, PO-modified glycerol trimethacrylate, and glycerol trimethacrylate. One of these compounds having a methacryloyloxy group may be used singly, or a mixture of two or more kinds thereof may be used. EO represents an ethyleneoxy group, and PO represents a propyleneoxy group.

Examples of the compound having a hydroxyl group include a polyalcohol such as dipentaerythritol, pentaerythritol, and glycerol. One of these compounds having a methacryloyloxy group may be used singly, or a mixture of two or more kinds thereof may be used.

The functional group of the component (B) is preferably a glycidyloxy group, an acryloyloxy group or a methacryloyloxy group, more preferably a glycidyloxy group or an acryloyl group, furthermore preferably an acryloyloxy group. From the viewpoint of developability, the component (B) is preferably an aliphatic compound having two or more glycidyloxy groups, more preferably an aliphatic compound having three or more glycidyloxy groups, and more preferably an aliphatic compound having a glycidyloxy group with a weight average molecular weight of 1000 or less.

The content of the component (B) is preferably 20 to 70 parts by mass, more preferably 25 to 65 parts by mass, further preferably 35 to 55 parts by mass, relative to 100 parts by mass of the component (A). With a content of the component (B) of 20 parts by mass or more, sufficient cross-linking occurs in an exposed portion, so that the resolution tends to be improved. With a content of 70 parts by mass or less, the photosensitive resin composition is easily deposited on a desired supporting material and the resolution tends to hardly deteriorate.

<Component (C)>

The photosensitive acid generator as component (C) is a compound which generates an acid by irradiation of active rays or the like. The catalytic effect of the generated acid allows the component (B) to cross link not only with each other, but also react with the phenolic hydroxyl group of the component (A), so that the solubility of the composition drastically decreases in a developer.

The component (C) is not specifically limited as long as being a compound which generates an acid with irradiation of active rays or the like, and examples thereof include an onium salt compound, a halogen-containing compound, a diazoketone compound, a sulfone compound, a sulfonic acid compound, a sulfonimide compound, and a diazomethane compound. Among them, use of a sulfonimide compound or an onium salt compound is preferred from the viewpoint of easy availability. In particular, when a solvent is used as the component (G), an onium salt compound is preferably used from the viewpoint of the solubility in the solvent. Specific examples thereof are as follows.

Onium Salt Compound:

Examples of the onium salt compound include an iodonium salt, a sulfonium salt, a phosphonium salt, a diazonium salt and a pyridinium salt. Preferred specific examples of the onium salt compound include a diaryliodonium salt such as a diphenyliodonium trifluoromethanesulfonate, diphenyliodonium p-toluenesulfonate, diphenyliodonium hexafluoroantimonate, diphenyliodonium hexafluorophosphate, diphenyliodonium tetrafluoroborate; a triarylsulfonium salt such as triphenylsulfonium trifluoromethanesulfonate, triphenylsulfonium p-toluenesulfonate, and triphenylsulfonium hexafluoroantimonate; 4-t-butylphenyl-diphenysulfonium trifluoromethanesulfonate; 4-t-butylphenyl-diphenylsulfonium p-toluenesulfonate; and 4,7-di-n-butoxynaphthyl tetrahydrothiophenium trifluoromethanesulfonate.

Sulfonimide Compound:

Specific examples of the sulfonimide compound include N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hept-5-ene-2,3-dicarboximide, N-(trifluoromethylsulfonyloxy)naphthalimide, N-(p-toluenesulfonyloxy)-1,8-naphthalimide, and N-(10-camphorsulfonyloxy)-1,8-naphthalimide.

In the present embodiment, the component (C) is preferably a compound having a trifluoromethanesulfonate group, a hexafluoroantimonate group, a hexafluorophosphate group, or a tetrafluoroborate group, in terms of having further excellent sensitivity and resolution. Incidentally, one of the component (C) may be used singly, or a mixture of two or more kinds of the components (C) may be used.

The content of the component (C) is preferably 0.1 to 15 parts by mass, more preferably 0.3 to 10 parts by mass, relative to 100 parts by mass of the component (A), from the viewpoint of ensuring the sensitivity, the resolution, the pattern shape, and the like of the photosensitive resin composition of the present embodiment.

<Component (D)>

When the photosensitive resin composition of the present embodiment comprises an inorganic filler having an average particle diameter of 100 nm or less as the component (D), the thermal expansion coefficient of the cured film obtained by heating the photosensitive layer after resin pattern formation can be decreased corresponding to the content of the component (D). From the viewpoint of suppressing the light scattering in the exposure wavelength region (e.g. 300 to 450 nm) of the photosensitive resin composition, i.e. suppressing the reduction in transmittance in the wavelength region of the exposing ray, the component (D) dispersed in the photosensitive resin composition has an average particle diameter of preferably 80 nm or less, more preferably 50 nm or less, furthermore preferably 30 nm or less. The lower limit of the average particle diameter of the component (D) may be, for example, 5 nm or more, though not particularly limited.

From the viewpoint of suppressing the reduction in the transmittance, the inorganic filler dispersed in the resin composition has a maximum particle diameter of preferably 2 μm or less, more preferably 1 μm or less, furthermore preferably 0.5 μm or less, particularly preferably 0.1 μm or less.

The average particle diameter of the inorganic filler is the average particle diameter of the inorganic filler in a state dispersed in the photosensitive resin composition, which is a value measured as follows. First, the photosensitive resin composition is diluted (or dissolved) 1000-fold with methyl ethyl ketone. The particles dispersed in the solvent are then measured in accordance with International Standard ISO 13321 at a refractive index of 1.38 using a submicron particle analyzer (manufactured by Beckman Coulter Inc., product name: N5). The particle diameter at a cumulative value of 50% (volume basis) in the particle size distribution is determined as the average particle diameter. The particle diameter at a cumulative value of 99.9% (volume basis) in the particle size distribution is determined as the maximum particle diameter. Further, a photosensitive layer disposed on a supporting material or a cured film of the photosensitive resin composition can be also diluted (or dissolved) 1000-fold (volume ratio) with a solvent as described above and then measured with the sub-micron particle analyzer.

The primary particle diameter is a value obtained by conversion from the BET specific surface area.

The inorganic filler is not particularly limited as long as capable of exhibiting the performance, and one of the filler may be used singly, or a mixture of two or more s may be used. Examples of the inorganic filler include: an aluminum compound such as aluminum oxide and aluminum hydroxide; an alkali metal compound; an alkali earth metal compound such as calcium carbonate, calcium hydroxide, barium sulfate, barium carbonate, magnesium oxide, and magnesium hydroxide; an inorganic compound derived from mining such as talc and mica; and silica such as fused spherical silica, fused crushed silica, fumed silica, and sol-gel silica. These may be crushed by a crusher and classified in some cases, enabling dispersion with a maximum particle diameter of 2 μm or less.

The preferred type of inorganic filler has a thermal expansion coefficient of $5.0 \times 10^{-6}/°$ C. or less. From the viewpoint of particle diameter, silica is more preferred, and fused spherical silica and fumed silica or sol-gel silica is further preferable. Among them, fumed silica or sol-gel silica is more preferred, and use of silica (nanosilica) with an average primary particle diameter in the range of 5 nm to 100 nm is further preferred.

The inorganic filler may be crushed by a crusher and classified in some cases, enabling dispersion with a maximum particle diameter of 2 μm or less in the photosensitive resin composition. Preferably the inorganic filler is surface treated with a surfactant such as a silane coupling agent so as to achieve improvement in dispersibility in the photosensitive resin composition.

In measuring the particle diameter of each of the inorganic fillers, it is desirable to use a known particle size analyzer. Examples thereof include a laser diffraction scattering particle size analyzer which obtains the particle size distribution by calculation based on the intensity distribution pattern of the diffracted and scattered light emitted from the particles irradiated with laser beams, and a nanoparticle size analyzer which obtains the particle size distribution using frequency analysis by a dynamic light scattering method.

The content of the inorganic filler is preferably 20 to 300 parts by mass, more preferably 50 to 300 parts by mass, furthermore preferably 100 to 300 parts by mass, relative to 100 parts by mass of the component (A). With a content of the inorganic filler of 20 parts by mass or more, the thermal expansion coefficient can be reduced, and with a content of 300 parts or less, an excellent resolution can be exhibited.

<Component (E)>

The photosensitive resin composition of the present embodiment may comprise a compound having at least one selected from the group consisting of an aromatic ring, a heterocycle and an alicycle, and a methylol group or an alkoxyalkyl group as the component (E). Herein, the aromatic ring means a hydrocarbon group having aromaticity (e.g. a hydrocarbon group having 6 to 10 carbon atoms), and examples thereof include a benzene ring and a naphthalene ring. The heterocycle means a cyclic group having at least one such as a nitrogen atom, an oxygen atom, and a sulfur atom (e.g. a cyclic group having 3 to 10 carbon atoms), and examples thereof include a pyridine ring, an imidazole ring, a pyrrolidinone ring, an oxazolidinone ring, an imidazolidinone ring and a pyrimidinone ring. Further, the alicycle means a cyclic hydrocarbon group having no aromaticity (e.g. a cyclic hydrocarbon group having 3 to 10 carbon atoms), and example thereof include a cyclopropane ring, a cyclobutane ring, a cyclopentane ring, and a cyclohexane ring. The alkoxyalkyl group means an alkyl group bonded to another alkyl group through an oxygen atom. The two alkyl groups may be different from each other, and examples thereof include an alkyl group having 1 to 10 carbon atoms.

Inclusion of the component (E) prevents the resin pattern from being embrittled and deformed when the photosensitive layer is cured by heating after formation of the resin pattern, due to formation of a cross-linked structure resulting from the reaction of the component (E) with the component (A), and the heat resistance can be improved. Specifically, a compound further having a phenolic hydroxyl group or a compound further having a hydroxymethylamino group can be preferably used, but the component (A) and the component (B) are not included in the component (E). One of the component (E) may be used singly, or a mixture of two or more of the components (E) may be used.

As described above, an acid is generated from the component (C) by irradiation of active rays or the like. Due to the catalytic action of the generated acid, the alkoxyalkyl groups in the component (E) can react each other, or the alkoxyalkyl group in the component (E) and the component (A) can react accompanied with dealcoholization to thereby form a pattern of negative type efficiently. Further, due to the catalytic action of the generated acid, the methylol groups in the component (E) can react each other, or the methylol group in the component (E) and the component (A) can react accompanying with dealcoholization, to thereby form a pattern of negative type.

As the component (E), a compound further having a phenolic hydroxyl group (excluding the component (A)) or a compound having a hydroxymethylamino group may be preferably used. One of the component (E) may be used singly, or a mixture of two or more thereof may be used.

The "compound having a phenolic hydroxyl group" for use as the component (E) increases the dissolution rate of the unexposed portion when developed in an alkali aqueous solution so as to improve the sensitivity. The weight average molecular weight of the compound having a phenolic hydroxyl group is preferably 94 to 2000, more preferably 108 to 2000, furthermore preferably 108 to 1500, in consideration of the well-balanced improvement of the solubility in an alkali aqueous solution, the photosensitivity, the mechanical properties and the like.

Although a conventionally known compound may be used as the compound having a phenolic hydroxyl group, a compound represented by the following formula (1) is preferred due to excellent balance between the effect for enhancing dissolution of an unexposed portion and the effect of preventing the resin pattern from deforming after curing by heating.

[Chemical Formula 8]

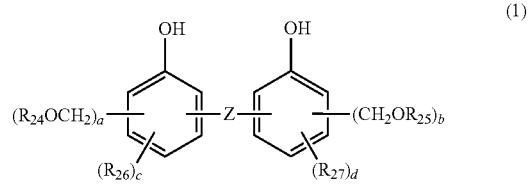

(1)

In the formula (1), Z represents a single bond or a divalent organic group, $R_{24}$ and $R_{25}$ each independently represent a hydrogen atom or a monovalent organic group, $R_{26}$ and $R_{27}$ each independently represent a monovalent organic group, a and b each independently represent an integer of 1 to 3, and c and d each independently represent an integer of 0 to 3. Herein, examples of the monovalent organic group include an alkyl group having 1 to 10 carbon atoms such as a methyl group, an ethyl group, and a propyl group; an alkenyl group having 2 to 10 carbon atoms such as a vinyl group; an aryl group having 6 to 30 carbon atoms such as a phenyl group;

and the above-described hydrocarbon groups of which a part or all of the hydrogen atoms are substituted with a halogen atom such as fluorine atom.

The compound represented by the formula (1) is preferably a compound represented by the formula (2).

[Chemical Formula 9]

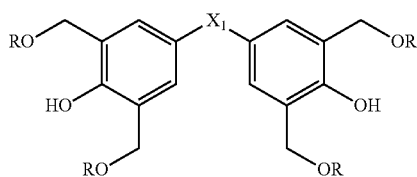

(2)

In the formula (2), $X_1$ represents a single bond or a divalent organic group, and R represents an alkyl group (e.g. an alkyl group having 1 to 10 carbon atoms).

As the compound having a phenolic hydroxyl group, a compound represented by the formula (3) may be used.

[Chemical Formula 10]

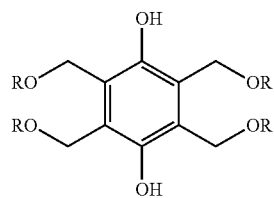

(3)

In the formula (3), R represents an alkyl group (e.g. an alkyl group having 1 to 10 carbon atoms).

The compound with a single bond as Z in the formula (1) is a biphenol(dihydroxy biphenyl) derivative. Further, examples of the divalent organic group represented by Z include: an alkylene group having 1 to 10 carbon atoms such as a methylene group, an ethylene group, and a propylene group; an alkylidene group having 2 to 10 carbons such as an ethylidene group; an arylene group having 6 to 30 carbon atoms such as a phenylene group; the above-described hydrocarbon groups of which a part or all of the hydrogen atoms are substituted with a halogen atom such as fluorine atom; a sulfonyl group; a carbonyl group; an ether bond; a sulfide bond; and an amide bond. Among these, Z is preferably a divalent organic group represented by the following formula (4).

[Chemical Formula 11]

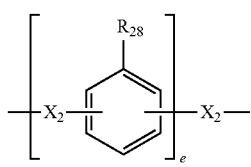

(4)

In the formula (4), $X_2$ represents a single bond, an alkylene group (e.g. an alkylene group having 1 to 10 carbon atoms), an alkylidene group (e.g. an alkylidene group having 2 to 10 carbon atoms), the above-described groups of which a part or all of the hydrogen atoms are substituted with a halogen atom, a sulfonyl group, a carbonyl group, an ether bond, a sulfide bond or an amide bond. $R_{28}$ represents a hydrogen atom, a hydroxyl group, an alkyl group (e.g. an alkyl group having 1 to 10 carbon atoms) or a haloalkyl group, and e represents an integer of 1 to 10. A plurality of $R_{28}$ may be the same or different from each other. Herein, the haloalkyl group means an alkyl group substituted with a halogen atom.

Examples of the compound having a hydroxymethylamino group include (poly)(N-hydroxymethyl)melamine, (poly)(N-hydroxymethyl)glycoluril, (poly)(N-hydroxymethyl)benzoguanamine, and (poly)(N-hydroxymethyl)urea. Alternatively, nitrogen-containing compounds, i.e. the above-described compounds of which a part or all of the hydroxymethylamino groups are alkyletherified, may be used. Herein, examples of the alkyl group of the alkyl ether include a methyl group, an ethyl group, a butyl group, and a mixture thereof, and also these compounds may be an oligomer component formed by partial self-condensation. Specific examples thereof include hexakis(methoxymethyl)melamine, hexakis(butoxymethyl)melamine, tetrakis(methoxymethyl)glycoluril, tetrakis(butoxymethyl)glycoluril, and tetrakis(methoxymethyl)urea.

Specifically, the compound having a hydroxymethylamino group is preferably a compound represented by the formula (5) or the formula (6).

[Chemical Formula 12]

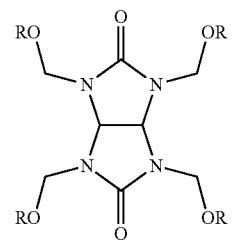

(5)

In the formula (5), R represents an alkyl group (e.g. an alkyl group having 1 to 10 carbon atoms).

[Chemical Formula 13]

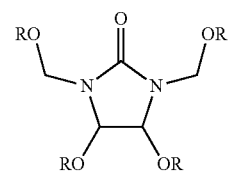

(6)

In the formula (6), R represents an alkyl group (e.g. an alkyl group having 1 to 10 carbon atoms).

The content of the component (E) is preferably 5 to 50 parts by mass, more preferably 5 to 30 parts by mass, relative to 100 parts by mass of the component (A). With a content of component (E) of 5 parts by mass or more, sufficient reaction is achieved in the exposed portion, so that the resolution hardly decreases and the chemical resistance and the heat resistance tend to be improved. With a content of 50 parts by mass or less, film formation of the photosensitive resin composition can be easily performed on a desired supporting material and the resolution hardly decreases.

<Component (F)>

The photosensitive resin composition of the present embodiment may further comprise a sensitizer as the component (F), on an as needed basis. The inclusion of the component (F) allows the sensitivity of the photosensitive resin composition to be improved. Examples of the sensitizer include 9,10-dibutoxyanthracene. One of the component (F) may be used singly, or a mixture of two or more of the components (F) may be used.

The content of the component (F) is preferably 0.01 to 1.5 parts by mass, more preferably 0.05 to 0.5 parts by mass, relative to 100 parts by mass of the component (A).

<Component (G)>

The photosensitive resin composition of the present embodiment may further comprise a solvent as the component (G), in order to improve the handling properties of the photosensitive resin composition or in order to adjust the viscosity and the storage stability. The component (G) is preferably an organic solvent. The type of the organic solvent is not particularly limited as long as capable of exhibiting the performance, and examples thereof include: ethylene glycol monoalkyl ether acetates such as ethylene glycol monomethyl ether acetate and ethylene glycol monoethyl ether acetate; propylene glycol monoalkyl ethers such as propylene glycol monomethyl ether, propylene glycol monoethyl ether, propylene glycol monopropyl ether, and propylene glycol monobutyl ether; propylene glycol dialkyl ethers such as propylene glycol dimethyl ether, propylene glycol diethyl ether, propylene glycol dipropyl ether, and propylene glycol dibutyl ether; propylene glycol monoalkyl ether acetates such as propylene glycol monomethyl ether acetate, propylene glycol monoethyl ether acetate, propylene glycol monopropyl ether acetate, and propylene glycol monobutyl ether acetate; cellosolves such as ethyl cellosolve and butyl cellosolve; carbitols such as butyl carbitol; lactic acid esters such as methyl lactate, ethyl lactate, n-propyl lactate, and isopropyl lactate; aliphatic carboxylates such as ethyl acetate, n-propyl acetate, isopropyl acetate, n-butyl acetate, isobutyl acetate, n-amyl acetate, isoamyl acetate, isopropyl propionate, n-butyl propionate, and isobutyl propionate; esters such as methyl 3-methoxypropionate, ethyl 3-methoxypropionate, methyl 3-ethoxypropionate, ethyl 3-ethoxypropionate, methyl pyruvate and ethyl pyruvate; aromatic hydrocarbons such as toluene and xylene; ketones such as 2-butanone, 2-heptanone, 3-heptanone, 4-heptanone and cyclohexanone; amides such as N,N-dimethylformamide, N-methylacetamide, N,N-dimethylacetamide and N-methylpyrrolidone; and lactones such as γ-butyrolactone. One of the organic solvent may be used singly, or a mixture of two or more may be used.

The content of the component (G) is preferably 30 to 200 parts by mass, more preferably 60 to 120 parts by mass, relative to 100 parts by mass of the total of the photosensitive resin composition excluding the component (G).

<Component (H)>

The photosensitive resin composition of the present embodiment may comprise a silane coupling agent as the component (H). The inclusion of the component (H) allows the adhesion strength between the photosensitive layer and the base material to be improved after formation of the resin pattern.

A commonly available compound can be used as the component (H), and examples of the compound include alkylsilane, alkoxysilane, vinylsilane, epoxysilane, aminosilane, acryloylsilane, methacryloylsilane, mercaptosilane, sulfide silane, isocyanate silane, sulfur silane, styrylsilane, alkylchlorosilane, etc.

Specific examples of the component (H) include methyltrimethoxysilane, dimethyldimethoxysilane, trimethylmethoxysilane, methyltriethoxysilane, methyltriphenoxysilane, ethyltrimethoxysilane, n-propyltrimethoxysilane, diisopropyldimethoxysilane, isobutyltrimethoxysilane, diisobutyldimethoxysilane, isobutyltriethoxysilane, n-hexyltrimethoxysilane, n-hexyltriethoxysilane, cyclohexylmethyldimethoxysilane, n-octyltriethoxysilane, n-dodecylmethoxysilane, phenyltrimethoxysilane, diphenyldimethoxysilane, triphenylsilanol, methyltrichlorosilane, dimethyldichlorosilane, trimethylchlorosilane, n-octyldimethylchlorosilane, tetraethoxysilane, 3-aminopropyltrimethoxysilane, 3-aminopropyltriethoxysilane, 3-(2-aminoethyl)aminopropyltrimethoxysilane, 3-(2-aminoethyl)aminopropylmethyldimethoxysilane, 3-phenylaminopropyltrimethoxysilane, 3-glycidoxypropyltrimethoxysilane, 3-glycidoxypropylmethyldimethoxysilane, 3-glycidoxypropyltriethoxysilane, 3-glycidoxypropylmethyldiethoxysilane, bis(3-(triethoxysilyl)propyl)disulfide, bis(3-(triethoxysilyl)propyl)tetrasullide, vinyltriacetoxysilane, vinyltrimethoxysilane, vinyltriethoxysilane, vinyltriisopropoxysilane, allyltrimethoxysilane, diallyldimethylsilane, 3-methacryloyloxypropyltrimethoxysilane, 3-methacryloyloxypropylmethyldimethoxysilane, 3-methacryloyloxypropyltriethoxysilane, 3-mercaptopropyltrimethoxysilane, 3-mercaptopropylmethyldimethoxysilane, 3-mercaptopropyltriethoxysilane, N-(1,3-dimethylbutylidene)-3-aminopropyltriethoxysilane, and aminosilane.

As the component (H), an epoxysilane having one or more glycidyloxy groups is preferred, and an epoxysilane having a trimethoxysilyl group or a triethoxysilyl group is more preferred. Alternatively, acryloylsilane or methacryloylsilane may be used.

From the viewpoint of high resolution, the component (H) is preferably epoxysilane, mercaptosilane, isocyanatosilane, acryloyl silane or methacryloyl silane, and more preferably acryloyl silane or methacryloyl silane.

The content of the component (H) is preferably 1 to 20 parts by mass, and more preferably 3 to 10 parts by mass, relative to 100 parts by mass of the component (A).

The photosensitive resin composition of the present embodiment may comprise a low-molecular weight phenolic compound having a molecular weight less than 1000 (hereinafter referred to as "phenol compound (a)") in addition to the component (A). Examples thereof include 4,4'-dihydroxydiphenylmethane, 4,4'-dihydroxydiphenyl ether, tris(4-hydroxyphenyl)methane, 1,1-bis(4-hydroxyphenyl)-1-phenylethane, tris(4-hydroxyphenyl)ethane, 1,3-bis[1-(4-hydroxyphenyl)-1-methylethyl]benzene, 1,4-bis[1-(4-hydroxyphenyl)-1-methylethyl]benzene, 4,6-bis[1-(4-hydroxyphenyl)-1-methylethyl]-1,3-dihydroxybenzene, 1,1-bis(4-hydroxyphenyl)-1-[4-{1-(4-hydroxyphenyl)-1-methylethyl}phenyl]ethane, 1,1,2,2-tetra(4-hydroxyphenyl)ethane, etc. These phenol compounds (a) can be contained in the range of 0 to 40 parts by mass, particularly 0 to 30 parts by mass, relative to 100 parts by mass of the component (A).

The photosensitive resin composition of the present embodiment may comprise components other than the components described above. Examples of the other components include an inhibitor of the reaction caused by the irradiation of active rays, an adhesion aid, and the like.

<Photosensitive Element>

The photosensitive element of the present embodiment will be described in the following.

The photosensitive element of the present embodiment includes a supporting material and a photosensitive layer comprising the above-described photosensitive resin composition formed on the supporting material. A protective film for covering the photosensitive layer may be further provided on the photosensitive layer.

Examples of the above-described supporting material for use include a polymer film of polyethylene terephthalate, polypropylene, polyethylene, polyester, or the like, having heat resistance and solvent resistance. The thickness of the supporting material (polymer film) is preferably set to 5 to 25 μm. Incidentally, one of the polymer films may be used as a supporting material and the other one as a protective film, so as to be laminated on each side of the photosensitive layer.

Examples of the above-described protective film for use include a polymer film of polyethylene terephthalate, polypropylene, polyethylene, polyester, or the like, having heat resistance and solvent resistance.

The photosensitive layer may be formed by applying the photosensitive resin composition on a supporting material or a protective film. Examples of the coating method include dipping, spraying, bar coating, roll coating, spin coating, etc. Although the thickness of a photosensitive layer is different according to the use, the dried photosensitive layer has a thickness of preferably 10 to 100 μm, more preferably 15 to 60 μm, particularly preferably 20 to 50 μm.

[Method for Forming Resist Pattern]

The method for forming a resist pattern of the present embodiment is described in the following.

First, a photosensitive layer comprising the above-described photosensitive resin composition is formed on a substrate (a copper foil coated with a resin, a copper-clad laminate, a silicon wafer coated with a metal-sputtered film, an alumina substrate, etc.) on which a resist is to be formed. Examples of the method for forming the photosensitive layer include: a method of applying the photosensitive resin composition to a substrate and drying so as to evaporate the solvent and the like to form a coating film (photosensitive layer); and a method of transferring the photosensitive layer of the above-described photosensitive element onto a substrate; etc.

Examples of the method for use in applying the photosensitive resin composition to a substrate include an application method such as dipping, spraying, bar coating, roll coating, spin coating, etc. The thickness of the coating film can be appropriately controlled by adjusting the coating means, and the solid content and viscosity of the photosensitive resin composition.

Subsequently, the photosensitive layer is exposed to a predetermined pattern through a predetermined mask pattern. Examples of the active rays for use in exposure include rays from a g-line stepper; ultraviolet rays from a low pressure mercury lamp, a high pressure mercury lamp, a metal halide lamp, and an i-line stepper; electron beams; laser beams; etc. The exposure amount is appropriately selected depending on the light source used and the thickness of a coating film, and the like, and may be, for example, about 100 to 5000 mJ/cm$^2$ for a coating film thickness of 10 to 50 μm with ultraviolet irradiation from a high pressure mercury lamp.

Further, a heat treatment is performed after exposure (post-exposure baking). The post-exposure baking can accelerate the curing reaction between the component (A) and the component (B) due to the generated acid. Although the conditions for the post-exposure baking are different depending on the content of the photosensitive resin composition, the thickness of the coating film, and the like, for example, heating at 70 to 150° C. for about 1 to 60 minutes is preferred, and heating at 80 to 120° C. for about 1 to 60 minutes is more preferred.

Subsequently, the coating film subjected to exposure and/or post-exposure baking is developed in an alkali developer to dissolve and remove a region other than a cured portion (unexposed portion), so that a desired resist pattern can be obtained. Examples of the development method in this case include shower developing, spray developing, dip developing, paddle developing, etc. Development conditions are, for example, at 20 to 40° C. for about 1 to 10 minutes.

Examples of the alkali developer include an alkali aqueous solution comprising an alkali compound such as sodium hydroxide, potassium hydroxide, tetramethylammonium hydroxide, choline, etc., dissolved in water at a concentration of 1 to 10 mass %, an alkali aqueous solution such as an aqueous ammonia solution, etc. A water soluble organic solvent such as methanol and ethanol, a surfactant, or the like in an appropriate amount may be added to the alkali developer. After development with the alkali developer, washing with water and drying are performed. Tetramethylammonium hydroxide is preferred as the alkali developer, in terms of achieving excellent resolution.

Further, through a heat treatment for imparting insulating film properties, a cured film (resist pattern) of the photosensitive resin composition is obtained. Curing conditions of the photosensitive resin composition are not specifically limited, so that the photosensitive resin composition can be cured by heating, for example, at 50 to 250° C. for 30 minutes to 10 hours, corresponding to the use of the cured product.

Further, the heat treatment may be performed in two stages for sufficient progress of curing and prevention of deformation of the obtained shape of a resin pattern. For example, curing may be performed by heating at 50 to 120° C. for 5 minutes to 2 hours in a first stage, and at 80 to 200° C. for 10 minutes to 10 hours in a second stage.

Heating facilities are not specifically limited as long as the above-described conditions are satisfied, so that an oven in common use, an infrared furnace, etc., may be used.

[Multi-layered Printed Wiring Board]

The cured product comprising the photosensitive resin composition of the present embodiment can be suitably used as, for example, a surface protective film or an interlayer insulating film of semiconductor devices, or a solder resist and/or an interlayer insulating film of multilayered printed wiring boards. FIG. 1 is a schematic view illustrating the manufacturing method of a multi-layered printed wiring board which includes the cured product formed from the photosensitive resin composition of the present embodiment as a solder resist and/or an interlayer insulating material. The multi-layered printed wiring board 100A shown in FIG. 1(f) has wiring patterns on the surface and on the inside. The multi-layered printed wiring board 100A is obtained by stacking a copper-clad laminate, an interlayer insulating material, and a metal foil, etc., and appropriately forming wiring patterns by etching or a semi-additive method. The manufacturing method of a multi-layered printed wiring board 100A is briefly described in the following with reference to FIG. 1.

First, interlayer insulating films 103 are respectively formed on each side of the copper-clad laminate 101 having a wiring pattern 102 on the surface (refer to FIG. 1(a)). The interlayer insulating films 103 may be formed by printing with a screen printing machine or a roll coater using the photosensitive resin composition, or by previously preparing the photosensitive element and sticking the photosensitive layer of the photosensitive element to the surface of a printed wiring board with a laminater. Subsequently, an openings 104 are formed at portions required to be electrically connected to the outside with YAG laser or carbon dioxide laser (refer to FIG. 1(b)). Smears (residues) around the openings 104 are removed by a desmearing treatment. Subsequently, a seed layer 105 is formed by electroless plating (refer to FIG. 1(c)). A photosensitive layer comprising the above-described photosensitive resin composition is formed on the seed layer 105, and predetermined portions are subjected to exposure and developing treatment so as to form a wiring pattern 106 (refer to FIG. 1(d)). Subsequently, a wiring pattern 107 is formed by electrolytic plating, and the cured product of the photosensitive resin composition is removed with a stripping solution. The seed layer 105 is then removed by etching (refer to FIG. 1(e)). The above-described operations are repeated, so that a solder resist 108 comprising the cured product of the photosensitive resin composition is formed on the outermost surface. Consequently the multi-layered printed wiring board 100A can be thus formed (refer to FIG. 1(f)).

The thus obtained multi-layered printed wiring board 100A allows the semiconductor elements mounted at corresponding positions to have ensured electrical connection.

EXAMPLES

The present invention will be illustrated in detail with reference to Examples as follows, but the present invention is not limited to the Examples in any way. In the following Examples and Comparative Examples, "part" means "part by mass" unless otherwise specified.

Examples 1 to 7 and Comparative Examples 1 to 3

A compound having a glycidyloxy group (B-1), compound having an acryloyl group (B-2), a photosensitive acid generator (C-1), an inorganic filler (an inorganic filler 1 to an inorganic filler 3), a compound having an alkoxyalkyl group (E-1), a sensitizer (F-1), and a solvent (G-1) in specified amounts shown in Table 1 were blended with 100 parts by mass of a novolac resin (A-1 to A-3) so as to obtain a photosensitive resin composition.

The photosensitive resin composition was applied on a polyethylene terephthalate film (made by Teijin DuPont Films Ltd., trade name: PUREX A53) (supporting material) so as to have a uniform thickness, and dried for 10 minutes with a hot air convection dryer at 90° C., so that a photosensitive element having a thickness of 25 μm after drying was formed.

<Measurement of Average Particle Diameter>

The photosensitive resin composition was diluted 1000-fold (volume ratio) with methyl ethyl ketone, and measured in accordance with International Standard ISO 13321 at a refractive index of 1.38 using a submicron particle analyzer (manufactured by Beckman Coulter Inc., product name: N5). The particle diameter at a cumulative value of 50% (volume basis) in the particle size distribution was determined as the average particle diameter of the inorganic filler dispersed in the photosensitive resin composition.

<Evaluation on Transparency>

The transmittance at a wavelength of 365 nm (i-line) of the photosensitive element was measured for a film thickness of 25 μm, using an ultraviolet and visible spectrophotometer (manufactured by Hitachi Ltd., product name: U-3310).

<Evaluation on Resolution>

The photosensitive element was laminated on a 6-inch silicon wafer using a heat roll at 100° C. with a compressive pressure of 0.4 MPa at a roll speed of 1.0 m/min. The prepared coating film was subjected to reduction projection exposure to i-line (365 nm) through a mask by using an i-line stepper (made by Canon Inc., trade name: FPA-3000iW). The mask for use had patterns with a width ratio between exposed portions and unexposed portions of 1:1 at 1 μm intervals from 2 μm:2 μm to 30 μm:30 μm. Further, reduction projection exposure was performed with changing the exposure amount was changed in the range of 100 to 3000 mJ/cm² at an interval of 100 mJ/cm².

Subsequently the exposed coating film was heated at 65° C. for 1 minute, and then at 95° C. for 4 minutes (post-exposure baking), and developed by immersing in 2.38 mass % tetramethylammonium hydroxide aqueous solution for a time period 1.5 times the shortest developing time period (the shortest time for removing the unexposed portion) for removal of the unexposed portion. After developing treatment, the formed resist pattern was observed with a metallurgical microscope. The smallest space width of the patterns having clearly removed space portions (unexposed portions) and line portions (exposed portions) formed without occurrence of meandering or chipping was assumed to be the minimum resolution, and the exposure amount on that occasion was evaluated.

<Evaluation of Heat Resistance>

The photosensitive resin composition in each of Examples 1 to 7 and Comparative Examples 1 and 3 was applied on a polyethylene terephthalate film (made by Teijin DuPont Films Ltd., trade name: PUREX A53) (supporting material) so as to have a uniform thickness, and dried for 10 minutes with a hot air convection dryer at 90° C., so that a photosensitive element having a thickness of a photosensitive layer of 40 μm after drying was formed. Subsequently, the photosensitive layer was exposed with an exposure machine having a high-pressure mercury lamp (made by ORC Manufacturing Co., Ltd., trade name: EXM-1201) so that the amount of the irradiated energy is 3000 mJ/cm². The exposed photosensitive layer was heated at 65° C. for 2 minutes and then at 95° C. for 8 minutes on a hot plate, subjected to a heat treatment at 180° C. for 60 minutes with a hot air convection dryer so as to obtain a cured film. Using a thermomechanical analyzer (made by Seiko Instruments Inc., trade name: TMA/SS6000), the thermal expansion coefficient of the cured film with temperature increase at a rate of temperature rise of 5° C./min was measured. From the measurement curve, an inflection point was obtained as the glass transition temperature Tg. Further, the thermal expansion coefficient was calculated from the thermal expansion amount for a tensile load of 5 g in the range from 40° C. to 150° C. The thermogravimetric reduction temperature was measured under atmospheric conditions at a temperature rising rate of 10° C./min, using a thermogravimetric-differential thermal analyzer (manufactured by Seiko Instruments Inc., product name: TG/DTA6300), and determined as the temperature at which the weight decreased by 3%. The evaluation results are shown in Table 1.

TABLE 1

| Item | Example 1 | Example 2 | Example 3 | Example 4 | Example 5 | Example 6 | Example 7 | Comparative Example 1 | Comparative Example 2 | Comparative Example 3 |
|---|---|---|---|---|---|---|---|---|---|---|
| A-1 | — | — | — | — | 100 | — | — | — | — | — |
| A-2 | 100 | 100 | 100 | 100 | — | 50 | 50 | 100 | 100 | 50 |
| A-3 | — | — | — | — | — | 50 | 50 | — | — | 50 |
| B-1 | 43 | 43 | 43 | 43 | 43 | — | — | 43 | 43 | — |
| B-2 | — | — | — | — | — | 43 | 43 | — | — | 43 |
| C-1 | 7 | 7 | 7 | 7 | 7 | 7 | 7 | 7 | 7 | 7 |
| Inorganic filler 1 | 50 | 120 | 300 | — | 50 | 50 | 120 | — | — | — |
| Inorganic filler 2 | — | — | — | 120 | — | — | — | — | — | — |
| Inorganic filler 3 | — | — | — | — | — | — | — | — | 120 | — |
| E-1 | 28 | 28 | 28 | 28 | 28 | 28 | 28 | 28 | 28 | 28 |
| F-1 | 0.1 | 0.1 | 0.1 | 0.1 | 0.1 | 0.1 | 0.1 | 0.1 | 0.1 | 0.1 |
| G-1 | 130 | 160 | 230 | 160 | 130 | 130 | 160 | 120 | 160 | 120 |
| Average particle diameter of inorganic filler (nm) | 25 | 25 | 45 | 80 | 25 | 25 | 25 | — | 160 | — |
| Transmittance at wavelength of 365 nm (%) | 83 | 83 | 75 | 70 | 80 | 81 | 82 | 82 | 40 | 81 |
| Minimum resolution (μm) | 5 | 6 | 15 | 15 | 5 | 9 | 15 | 5 | >30 | 7 |
| Tg (° C.) | 202 | 203 | 200 | 205 | 197 | 187 | 183 | 205 | — | 185 |
| Thermal expansion coefficient (×10$^{-6}$/° C.) | 50 | 41 | 32 | 41 | 55 | 52 | 45 | 65 | — | 61 |
| 3%-Thermogravimetric reduction temperature | 288 | 307 | 325 | 305 | 285 | 290 | 315 | 270 | — | 280 |

A-1: novolac resin (made by Asahi Organic Chemicals Industry Co., Ltd., trade name: MXP5560BF, weight-average molecular weight: 7800)
A-2: cresol novolac resin (made by Asahi Organic Chemicals Industry Co., Ltd., trade name: TR4020G)
A-3: cresol novolac resin (made by Asahi Organic Chemicals Industry Co., Ltd., trade name: TR4080G)
B-1: trimethylolpropane triglycidyl ether (made by Nippon Steel and Sumikin Chemical Co., Ltd., trade name: ZX-1542, refer to the following Formula (14))
[Chemical Formula 14]

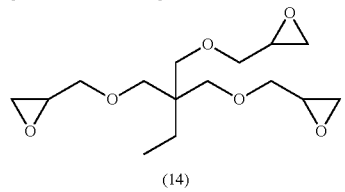 [SMILES: CCC(COCC1CO1)(COCC1CO1)COCC1CO1]

(14)

B-2: pentaerythritol triacrylate (manufactured by Nippon Kayaku Co., Ltd., product name: PET-30)
C-1: triarylsulfonium salt (made by San-Apro Ltd., trade name: CPI-101A)
Inorganic filler 1: sol-gel silica having an average primary particle diameter of 15 nm, coupling treated with 3-methacryloyloxypropyltrimethoxysilane
Inorganic filler 2: sol-gel silica having an average primary particle diameter of 45 nm, coupling treated with 3-methacryloyloxypropyltrimethoxysilane
Inorganic filler 3: sol-gel silica having an average primary particle diameter of 120 nm, coupling treated with 3-methacryloyloxypropyltrimethoxysilane
E-1: glycoluril derivative (manufactured by Sanwa Chemical Co., Ltd., product name: MX-270)
F-1: 9,10-dibutoxyanthracene (made by Kawasaki Kasei Chemicals Ltd., trade name: DBA)
G-1: Methyl ethyl ketone (made by Wako Pure Chemical Industries, Ltd., trade name: 2-BUTANONE)

As clearly shown in Table 1, Examples 1 to 7 comprising an inorganic filler having an average particle diameter of 80 nm or less in the photosensitive resin composition had a high transmittance of 70% or more and an excellent resolution of 15 μm or less. In contrast, Comparative Example 1 not comprising inorganic filler had a high thermal expansion coefficient and a low 3%-thermogravimetric reduction temperature with poor heat resistance. Comparative Example 2 having an inorganic filler with an average particle diameter of more than 100 μm in the photosensitive resin composition had a low transmittance of 40% or less and an insufficient resolution of more than 30 μm. Further, it was found that in Examples 1 to 4, corresponding to the increase of the inorganic filler content, the thermal expansion coefficient decreases and the 3%-thermogravimetric reduction temperature increases, having excellent balance among the resolution, the heat resistance, and the thermal expansion coefficient.

INDUSTRIAL APPLICABILITY

The photosensitive resin composition of the present invention is used as a material for use in the surface protective film or the interlayer insulating film of semiconductor devices. The photosensitive resin composition is used also as a material for use in the solder resist or the interlayer insulating film of wiring board materials. In particular, having both of the excellent resolution and the excellent heat resistance after curing, with a satisfactorily low thermal expansion coefficient, the photosensitive resin composition can be suitably used in thinned and densified highly integrated package substrates and the like.

REFERENCE SIGNS LIST

100A: MULTI-LAYERED PRINTED WIRING BOARD; 101: COPPER-CLAD LAMINATE; 102, 106, AND 107: WIRING PATTERN; 103: INTERLAYER INSULATING FILM; 104: OPENING; 105: SEED LAYER; 108: SOLDER RESIST

The invention claimed is:
1. A photosensitive resin composition comprising:
   a component (A): a resin having a phenolic hydroxyl group;

a component (B): an aliphatic compound having two or more functional groups, the functional groups being one or more groups selected from an acryloyloxy group, a methacryloyloxy group, a glycidyloxy group and a hydroxyl group;

a component (C): a photosensitive acid generator comprising an onium salt compound, a halogen-containing compound, a sulfone compound, a sulfonimide compound, or a diazomethane compound; and a component (D): an inorganic filler having an average particle diameter of 100 nm or less.

2. The photosensitive resin composition according to claim 1, wherein the component (B) is an aliphatic compound having three or more functional groups, the functional groups being one or more groups selected from an acryloyloxy group, a methacryloyloxy group, a glycidyloxy group and a hydroxyl group.

3. The photosensitive resin composition according to claim 1, further comprising:

a component (E): a compound having at least one selected from the group consisting of an aromatic ring, a heterocycle and an alicycle, and having a methylol group or an alkoxyalkyl group.

4. The photosensitive resin composition according to claim 1, wherein the content of the component (B) is 20 to 70 parts by mass relative to 100 parts by mass of the component (A).

5. The photosensitive resin composition according to claim 1, wherein the component (D) is silica.

6. A photosensitive element comprising a supporting material and a photosensitive layer formed on the supporting material, the photosensitive layer being formed using the photosensitive resin composition according to claim 1.

7. A cured product of the photosensitive resin composition according to claim 1.

8. A method for forming a resist pattern, comprising:

a step of applying the photosensitive resin composition according to claim 1 onto a substrate and drying the applied photosensitive resin composition so as to form a photosensitive layer;

a step of exposing the photosensitive layer to an active ray in order to form a predetermined pattern and performing a heat-treatment after exposure; and a step of developing the photosensitive layer after heat-treatment and heat-treating the obtained resin pattern.

9. A method for forming a resist pattern, comprising:

a step of transferring the photosensitive layer of the photosensitive element according to claim 6 onto a substrate;

a step of exposing the photosensitive layer to an active ray in order to form a predetermined pattern and performing a post-exposure heat-treatment; and a step of developing the photosensitive layer after heat-treatment and heat-treating the obtained resin pattern.

10. The photosensitive resin composition according to claim 2, further comprising:

a component (E): a compound having at least one selected from the group consisting of an aromatic ring, a heterocycle and an alicycle, and having a methylol group or an alkoxyalkyl group.

11. The photosensitive resin composition according to claim 2, wherein the content of the component (B) is 20 to 70 parts by mass relative to 100 parts by mass of the component (A).

12. The photosensitive resin composition according to claim 3, wherein the content of the component (B) is 20 to 70 parts by mass relative to 100 parts by mass of the component (A).

13. The photosensitive resin composition according to claim 2, wherein the component (D) is silica.

14. The photosensitive resin composition according to claim 3, wherein the component (D) is silica.

15. The photosensitive resin composition according to claim 4, wherein the component (D) is silica.

16. A photosensitive element comprising a supporting material and a photosensitive layer formed on the supporting material, the photosensitive layer being formed using the photosensitive resin composition according to claim 2.

17. A photosensitive element comprising a supporting material and a photosensitive layer formed on the supporting material, the photosensitive layer being formed using the photosensitive resin composition according to claim 3.

18. A photosensitive element comprising a supporting material and a photosensitive layer formed on the supporting material, the photosensitive layer being formed using the photosensitive resin composition according to claim 4.

19. A photosensitive element comprising a supporting material and a photosensitive layer formed on the supporting material, the photosensitive layer being formed using the photosensitive resin composition according to claim 5.

20. A cured product of the photosensitive resin composition according to claim 2.

\* \* \* \* \*